United States Patent [19]

Clapp, III et al.

[11] Patent Number: 5,539,334

[45] Date of Patent: Jul. 23, 1996

[54] METHOD AND APPARATUS FOR HIGH VOLTAGE LEVEL SHIFTING

[75] Inventors: John S. Clapp, III; Wayne T. Chen, both of Plano, Tex.

[73] Assignee: Texas Instruments Incorporated, Dallas, Tex.

[21] Appl. No.: 991,622

[22] Filed: Dec. 16, 1992

[51] Int. Cl.[6] .................. H03K 19/0185; H03K 19/003
[52] U.S. Cl. ................... 326/68; 326/30; 326/9; 327/318
[58] Field of Search .................. 307/451, 475, 307/443, 448, 552, 559, 568, 296.6, 561, 565; 326/68, 81, 30, 21, 9, 121, 63; 327/530, 314, 318

[56] References Cited

U.S. PATENT DOCUMENTS

| | | | |
|---|---|---|---|
| 4,039,862 | 8/1977 | Dingwall et al. | 307/475 |
| 4,675,551 | 6/1987 | Stevenson et al. | 307/561 |
| 4,945,258 | 7/1990 | Picard et al. | 307/443 |
| 4,996,443 | 2/1991 | Tateno | 307/451 |
| 5,097,153 | 3/1992 | Mahler et al. | 307/451 |
| 5,107,144 | 4/1992 | Hirayama | 307/565 |
| 5,122,692 | 6/1992 | Seki | 307/475 |
| 5,182,479 | 1/1993 | Behagel et al. | 307/451 |
| 5,243,236 | 9/1993 | McDaniel | 307/443 |

*Primary Examiner*—David R. Hudspeth
*Assistant Examiner*—Jon Santamauro
*Attorney, Agent, or Firm*—Robby T. Holland; Wade James Brady, II; Richard L. Donaldson

[57] ABSTRACT

A voltage level shifter circuit (10) for outputting an output high (18) and output low (18) signal is provided which accommodates multiple power supplies (12 and 22) at different relative voltage to each other. The voltage level shifter (10) includes an input stage (24) which is characterized by voltage ranges applicable to the process used to make the circuit. The voltage level shifter circuit includes an output stage (18) which is also characterized by the same voltage ranges which cannot be exceeded. The output stage outputs the translated output high (16) and output low (18) voltage signals. A clamping network (20) is employed to ensure that the output stage voltage ranges are not exceeded. The present invention implements a high voltage level shifter (10) using low voltage components by extending the breakdown capability of the voltage level shifter circuit (10) past the breakdown voltage of any single component in the circuit.

1 Claim, 2 Drawing Sheets

5,539,334

METHOD AND APPARATUS FOR HIGH VOLTAGE LEVEL SHIFTING

TECHNICAL FIELD OF THE INVENTION

This invention relates in general to the field of electronic circuits, and more particularly to an improved method and apparatus for high level voltage shifting.

BACKGROUND OF THE INVENTION

Voltage level shifter circuits are used in applications where input logic voltage level signals must be translated to output signals at higher voltage levels. For example, automotive, electronic data processing, and industrial control applications require high voltage level shifter circuits to drive various peripheral devices. Such circuits are often implemented in application specific integrated circuits (ASICs) or as independently packaged circuits.

High voltage level shifter circuits translate a logic level (0 to 5 volts) input signal to signals at high voltage levels. Voltage level shifter circuits normally receive two differential input signals and output two differential output signals at different voltages than the input signals. Ideally, voltage level shifter circuits should draw no DC current from the power supplies used to determine the desired output voltages. The output voltages attainable are a function of the power supplies to the shifter circuit and the capabilities of the devices used to build the circuit.

Voltage level shifter circuits are usually implemented with logic level devices, fabricated using metal oxide semiconductor field effect transistors (MOSFETS). MOSFETs are used because they are small in size and can be easily fabricated using standard semiconductor processing techniques. With logic level signals input to a voltage level shifter circuit, the desired output voltages can be achieved so long as those output voltages are relatively low. Voltage level shifter circuits fabricated using bipolar transistors also have limitations in high voltage applications. The maximum collector to emitter voltage with the base open circuited ($V_{BCEO}$) is easily exceeded on the input transistors of a standard voltage level shifter circuit, and such circuits therefore fail when high voltage levels are applied.

The semiconductor processing techniques used to manufacture circuits result in limitations to the maximum voltage ranges that may be applied across the transistor used in the circuits. For example, the typical maximum rated gate to source voltage of a transistor is limited by the gate to source oxide thickness of the transistor. For example, the typical maximum gate to source voltage of a low voltage MOSFET is 20 volts. Semiconductor processing will also limit the maximum rated gate to drain voltage of a transistor. A typical maximum gate to drain voltage of a low voltage MOSFET is 60 volts. Finally, the voltage across the drain to source of a transistor is also limited to a maximum rated voltage for that process. A typical maximum drain to source voltage for a low voltage MOSFET is 40 volts when the transistor is on and 60 volts when it is off. If the maximum drain to source voltage of a conducting transistor is exceeded, hot electron effects within the transistor will degrade the reliability of the transistor.

In many applications, however, such as where the output voltages required exceed the basic capabilities of the process used to fabricate the transistors of the shifter circuit, existing approaches are ineffective. Using low level or logic level transistors in such applications leads to overstress of these devices. As the breakdown voltages for the transistors within the voltage level shifter circuit are exceeded, the devices may fail or the reliability of the transistors will degrade. To achieve higher voltages at the output of the voltage level shifter circuit, one approach has been to make use of high voltage transistors. High voltage transistors are generally larger than the low voltage transistors, and therefore require more area on a semiconductor chip and limit the amount of circuitry within a given semiconductor chip.

Therefore, a need has arisen for an improved method and apparatus for voltage level shifting which uses low voltage transistors to achieve high level voltage shifts.

SUMMARY OF THE INVENTION

In accordance with the present invention, a method and apparatus for high voltage level shifting is provided which substantially eliminates and reduces disadvantages or problems associated with prior voltage level shifter circuits.

A voltage level shifter circuit for outputting an output high and an output low signal is provided. The voltage level shifter circuit includes an input stage for receiving input high and input low signals at different relative voltage levels. The voltage level shifter circuit includes an output stage with predetermined voltage ranges, and the output stage generates the output high and output low signals at different relative voltages and at different voltage levels from the voltage levels of the input signals. The predetermined voltage ranges of the output stage are the breakdown voltages of the transistors in the output stage. The voltage level shifter circuit uses a clamping network between the input stage and output stage to ensure that the predetermined voltage ranges of the output stage are not exceeded.

An important technical advantage of the present invention is that it implements a high voltage level shifter using low voltage components by extending the breakdown capability of the voltage level shifter circuit past the breakdown voltage of any single component in the circuit. The voltage level shifter circuit described herein can be used in any application with multiple power supplies and yet draw substantially no DC current from those power supplies in its operation. This invention allows for controlling high voltage devices with logic level devices on a single microcircuit chip. Combining high voltage and low voltage transistors on the same chip allows a circuit designer to achieve higher levels of integration using low voltage devices in applications where high voltages are required.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

The preferred embodiment of the present invention and its advantages are best understood by referring to FIGS. 1–6 of the drawings, like numerals being used for like and corresponding parts of the various drawings.

Figure 1:
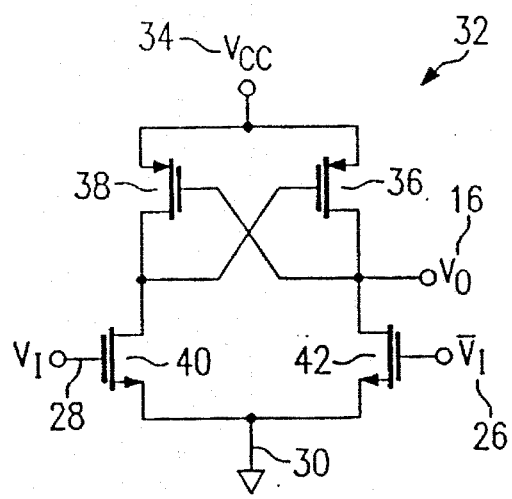
FIG. 1 illustrates the prior art standard voltage level shifter.

Prior voltage level shifter circuits, an example of which is shown in FIG. 1, can only achieve output voltages that are limited by the breakdown voltages associated with the semiconductor process used to implement the circuits. The use of low voltage transistors in voltage level shifter circuits restricts the achievable output voltages of the circuits. The prior art voltage level shifter circuit shown in FIG. 1 using low voltage transistors is unable to achieve high level output voltages. The prior art level shifter circuit 32 comprises two n-channel transistors 40 and 42 which are coupled to ground 30 and provide the input low node 26 and input high node 28. The two n-channel transistors 40 and 42 are coupled to two p-channel transistors 36 and 38. The p-channel transistors 36 and 38 are coupled to the circuit power supply 34 ($V_{cc}$). In operation of the prior art circuit of FIG. 1, once the power supply 34 voltage goes above the maximum rated gate to source voltage of transistors 36 and 38, the gate oxide of 36 and 38 will be destroyed and circuit 32 fails.

Figure 2:
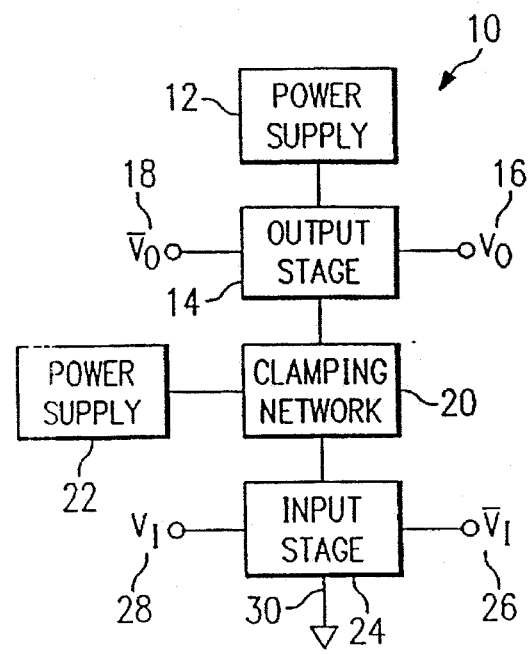
FIG. 2 illustrates a block diagram of one embodiment of the present invention.

The present invention is depicted in FIG. 2 and shows a block diagram of the high voltage level shifter circuit 10. Level shifter circuit 10 includes a plurality of power supplies shown as power supply 12 and power supply 22. An input stage 24 has two nodes; an input low node 26 for receiving an input signal $\overline{V}_i$ and an input high node 28 for receiving an input signal $V_i$, and is also connected to ground 30. An output stage 14 also has two nodes; an output high node 16 for generating an output signal $V_o$ and an output low node 18 for generating an output signal $\overline{V}_o$, and is connected to power supply 12 and the clamping network 20. Clamping network 20 is connected to the output stage 14 and the input stage 24 as well as power supply 22. The clamping network 20 prevents the maximum breakdown voltages of the output stage from being exceeded.

Figure 3:
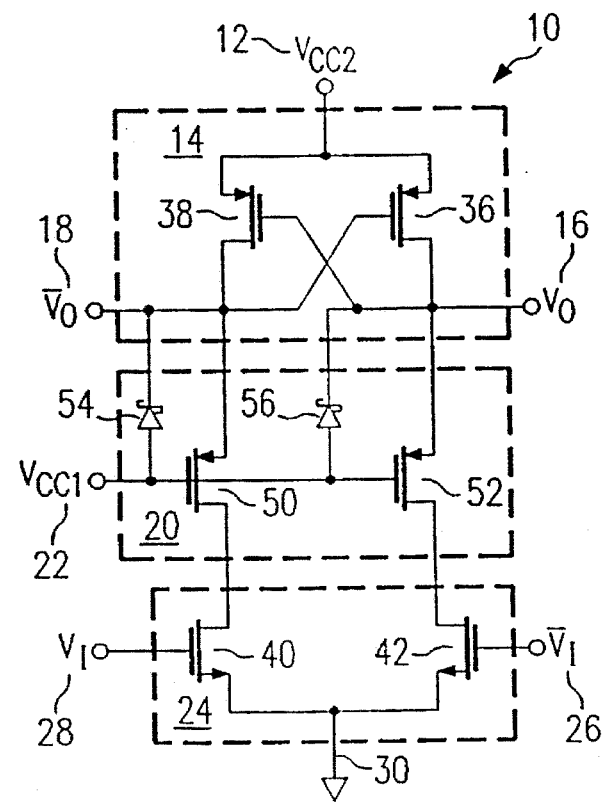
FIG. 3 illustrates a circuit schematic of one embodiment of the present invention.

One embodiment of the present invention shown in FIG. 2 is shown in FIG. 3. In this embodiment the input stage 24 includes two n-channel transistors 40 and 42, and has nodes for input low node ($\overline{V}_i$) 26 and input high node ($V_i$) 28. The first n-channel transistor 40 has its source connected to ground 30, its gate is the input high node 28, and its drain is connected to the drain of 50. The second n-channel transistor 42 within the input stage 24 has its source connected to ground 30, its gate is the input low node 26, and its drain is connected to the drain of 52.

The clamping network 20 includes two p-channel transistors 50 and 52 and two Schottky diodes 54 and 56. The clamping network is connected to the first power supply 22 ($V_{cc1}$), the output stage 14, and the input stage 24. Within the clamping network 20, transistor 50 has its gate connected to the first power supply 22, the anode of diode 54, the gate of transistor 52 and the anode of diode 56. The source of transistor 50 is connected to the cathode of diode 54, the drain of transistor 38, the gate of transistor 36, and the output low node 18. The source of transistor 52 is connected to the output high node 16, the gate of transistor 38, the drain of transistor 36, and the cathode of diode 56.

The output stage 14 includes two p-channel transistors 36 and 38, and is coupled to power supply 12 ($V_{cc2}$). The output stage 14 includes nodes 16 and 18 for output high ($V_o$) and output low ($\overline{V}_o$) respectively. The source of transistor 36 is connected to power supply 12 ($V_{cc2}$). The source of transistor 38 is also connected to power supply 12 ($V_{cc2}$). All other connections for transistors 36 and 38 are as discussed above.

In operation of the embodiment shown in FIG. 3, n-channel transistors 40 and 42 and p-channel transistors 36 and 38 perform the voltage level shifting function described above for the embodiment shown in FIG. 1. P-channel transistors 50 and 52, and diodes 54 and 56, form a clamping network 20 that keeps the voltages at output high node 16 and output low node 18 from dropping below the gate to source destruction voltage of transistors 36 and 38. The Schottky diodes 54 and 56 provide additional protection that assures output high node 16 and output low node 18 cannot be driven below power supply 22 less the forward voltage drop of diodes 54 and 56 by capacitive coupling or parasitic leakage effects.

Specifically, with input high node 28 at 5 volts and input low node 26 at 0 volts, transistor 40 is on and transistor 42 is off. The output low node 18 voltage will be at power supply 22 voltage ($V_{cc1}$) plus the threshold voltage of transistor 50. Therefore, transistor 36 will be on and will pull the output high node 16 to power supply 12 ($V_{cc2}$) voltage. With output high node 16 at the power supply 12 voltage, transistor 52 turns on, but does not conduct current since transistor 42 is off. With output high node 16 voltage at the power supply 12 voltage, transistor 38 is off. There is, therefore, substantially no DC current flowing anywhere in the circuit. This is partially accomplished by maintaining both diodes 54 and 56 in a reverse biased condition.

In order to change the state of the level shifter circuit 10 of FIG. 3, the input high node 28 transitions from its previous level at 5 volts to 0 volts, and the input low node 26 transitions from 0 volts to 5 volts. This results in transistor 40 turning off and transistor 42 turning on. Transistor 40 turning off has no effect on the output low node 18 voltage, but as transistor 42 turns on it pulls output high node 16 low through transistor 52. Transistor 52 remains on until output high node 16 is pulled down to the voltage at the power supply 22 plus the threshold voltage of transistor 52. As output high node 16 goes low, transistor 38 turns on, thus pulling the output low node 18 up to the second power supply 12. This causes transistor 50 to turn on, but since transistor 40 is off no DC current flows in the circuit from power supply 22. Diodes 54 and 56 again remain reverse biased and do not conduct current.

Parasitic effects within the circuit could cause charge to be taken out of the output high node 16 or output low node 18 when either node is being taken low or high. To prevent gate breakdown in transistors 36, 38, 50, 52, diodes 54 and 56 become forward biased when either output high node 16 or output low node 18 is taken lower than power supply 22 minus the voltage across diodes 54 or 56. Diodes 54 and 56 clamp output high node 16 or output low node 18 at the voltage at power supply 22 less the voltage drop across diode 54 or 56 respectively.

Thus, the circuit shown in FIG. 3 allows a level shifter design which, as discussed above, prevents a DC current drain out of either power supply 12 or 22. Clamp device transistors 50 and 52 and diodes 54 and 56 allow the output high node 16 and output low node 18 to exceed the maximum rated voltages of the devices within the circuit.

Figure 4:
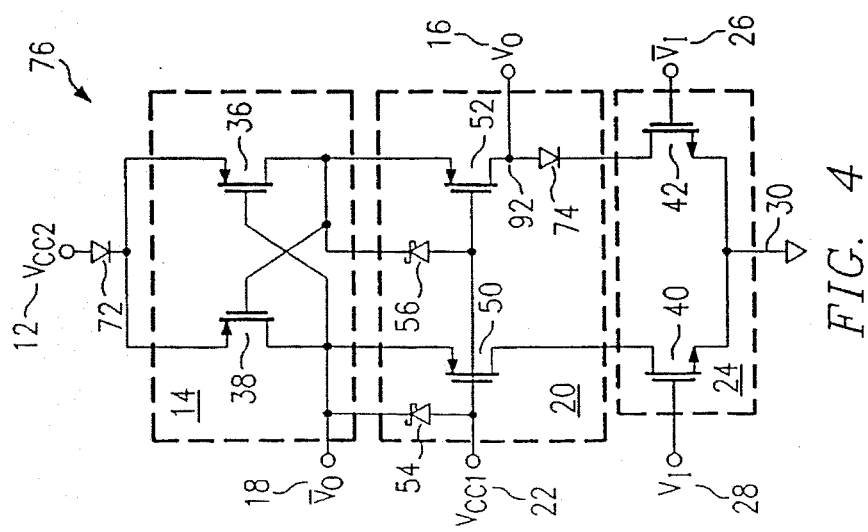
FIG. 4 illustrates a circuit schematic of one embodiment of the present invention with output high signal swing from the voltage at the second power supply to ground.

Another embodiment of the present invention is shown in FIG. 4. In applications where the high level output node 16 is required to swing from the voltage at the second power supply 12 to ground 30, the output high node 16 is provided by the clamping network 20 as shown in FIG. 4 at node 92 to provide high level voltage level shifter 76. In this embodiment, a diode 74 is placed between the drain of transistor 52 and the drain of transistor 42. In this application, output high node 16 is connected to the drain of transistor 52 and the anode of diode 74 at node 92. Additionally, when multiple voltage level shifters are included in the same chip, a power supply blocking diode 72 can be placed between the power supply 12 and the source of transistor 38 and the source of transistor 36 within output stage 20. Diode 72 prevents back current if another voltage level shifter pulls power supply 22 down. All other connections remain the same as those for the high voltage level shifter 10 of FIG. 3.

An additional feature of the circuit shown in FIG. 4 is that diode 72 is employed to minimize circuit to circuit crosstalk. With several level shifters on a chip connected to a power supply 12, a single shifter may disrupt the voltage on power supply 12 while that channel is shifting. During this shifting, other voltage level shifter circuits on the same chip in the high state will have their outputs disrupted. In the circuit of FIG. 4 diode 72 will prevent any reverse current flows back into the power supply 12 during such interruptions, thus helping to preserve the voltage level at output high node 16.

Also, in the embodiment shown in FIG. 4, output high node 16 can range from power supply 12 to ground 30. Diode 74 is provided to ensure that node 16 can go below ground.

Figure 5:
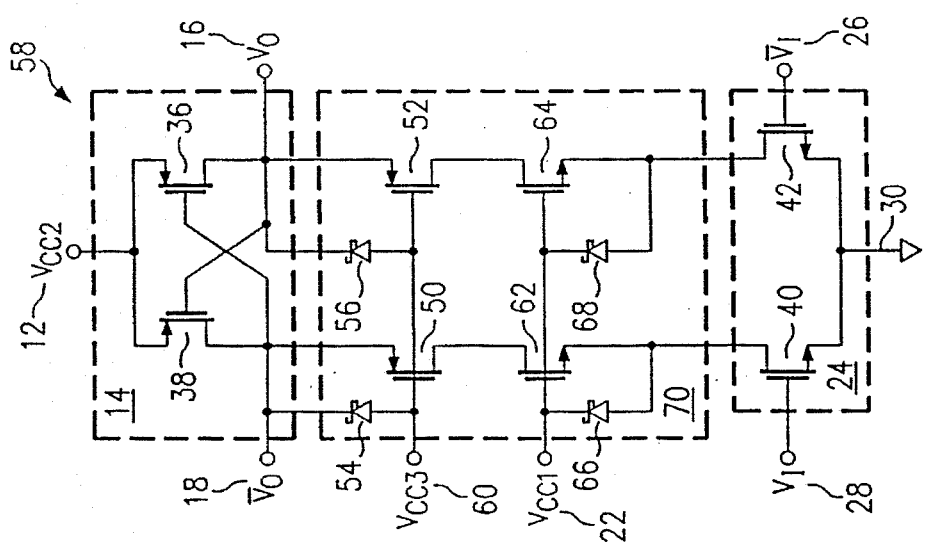
FIG. 5 illustrates a circuit schematic of one embodiment of the present invention with extended voltage output high signal capabilities.

FIG. 5 is an illustration of another embodiment of a high voltage level shifter according to the present invention. This high voltage level shifter 58 is similar to the circuit of in FIG. 3 with additional circuit elements contained within the clamping network 70. The additions to the clamping network 70 include n-channel transistors 62 and 64, along with Schottky diodes 66 and 68. Transistors 62 and 64 and diodes 66 and 68 extend the allowable range of the voltage at the second power supply 12. A third power supply 60 ($V_{cc3}$) may also be accommodated with voltage level shifter 58.

Referring to FIG. 5, the anode of Schottky diode 66 is connected to the drain of transistor 40 and the source of transistor 62. The cathode of diode 66 is connected to power supply 22, the gate of transistor 62, the gate of transistor 64, and the cathode of diode 68. The n-channel transistor 62 also has its source connected to the drain of transistor 40. The drain of transistor 62 is connected to the drain of transistor 50. The other n-channel transistor 64 has its source connected to the drain of transistor 42 and the anode of diode 68. The drain of transistor 64 is connected to the drain of transistor 52. All other connections are as described for the embodiment shown in FIG. 4.

In operation of voltage level shifter 58, power supply 22 is set at the maximum allowable voltage so as not to exceed the rated gate to source voltage of transistors 62 and 64. This allows power supply 12 to go as high as the maximum rated gate to drain voltage of transistors 36 and 38. Power supply 60 must not be less than the voltage at power supply 12 by more than the maximum gate to source voltage of transistors 36 and 38.

In the embodiment shown in FIG. 5, diodes 66 and 68 perform a similar function as diodes 54 and 56 by clamping the drains of 40 and 42 to prevent the drain to source voltages of transistors 40 and 42 from being pushed above their maximum ratings due to parasitic coupling and parasitic leakage effects. When transistors 62 and 64 are off, the impedance at the drains of transistors 40 and 42 is high. Diodes 66 and 68 provide a low impedance clamp path to power supply 22.

By properly selecting power supplies 22 and 60, the output of the level shifter can be guaranteed to be in a known state even during ramp up of power supply 12. With power supply 60 selected to be less than or equal to power supply 12 less twice the threshold of the p-channel devices 36 and 38, and power supply 22 selected to be less than or equal to the power supply 60 less the threshold voltage of the n-channel transistors 40 and 42, then cascode transistors 50, 52, 62, and 64 will be able to conduct at the appropriate times.

Figure 6:
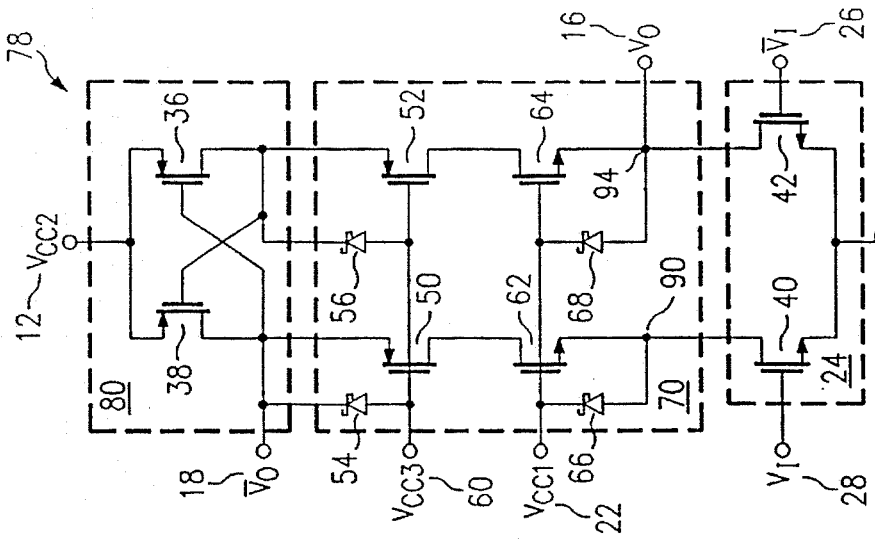
FIG. 6 illustrates a circuit schematic of one embodiment of the present invention for low side applications.

The high level voltage shifter 58 of FIG. 5 can be modified with the output high node 16 provided by the clamping network 70 at node 94, as shown in FIG. 6. All other connections for the circuit 78 shown in FIG. 6 are the same as for the high level shifter 58 and as shown in FIG. 5. In this embodiment, however, output high node 16 is located between the source of transistor 64, the drain of transistor 42, and also to the anode of diode 68 at node 94.

The embodiment of FIG. 6 is appropriate for "low side" applications. Normally a level shifter is not required in "low side" applications since the upper power supply 12 does not exceed the maximum gate to source voltage of transistors 36 and 38. However, in applications where this is not true, a level shifter will be needed. In the embodiment of FIG. 6, transistor 62 clamps node 90 located between the source of transistor 62, the drain of transistor 40, and the anode of diode 66 so that it will not exceed the maximum drain to source voltage of transistor 40. Transistor 64 clamps node 94 and output high node 88 voltage from exceeding the maximum drain to source voltage of transistor 42. However, power supply 22 must be selected so that output high node 16 does not exceed the maximum gate to source voltage of transistors 40 and 42.

The present invention has been discussed in connection with MOSFET technologies, it being understood that the inventive principles apply to other technologies.

Although the present invention has been described in detail, it should be understand that various changes, substitutions and alterations can be made hereto without departing from the spirit and scope of the invention as defined by the appended claims.

What is claimed is:

1. A voltage level shifter circuit comprising:
   a plurality of power supplies including at least a first power supply and a second power supply, each of said power supplies operable to generate power supply voltage levels, and further including a third power supply;
   an input stage operable to receive input high and input low signals, said input signals at different relative voltage levels;
   an output stage coupled to said second power supply, said output stage characterized by voltage ranges and operable to generate said output high signal and said output low signal, said output signals at different relative voltage levels and at different voltage levels than said input signals; and
   a clamping network coupled to said first power supply, said third power supply, said input stage, and said output stage, said clamping network operable to extend the allowable range of said second power supply without exceeding said voltage ranges of said output stage, the clamping network including four transistors coupled between said input and said output stage, two Schottky diodes coupled between the third power supply and the output stage, and two Schottky diodes coupled between the first power supply and the input stage.

* * * * *